United States Patent
Ashby et al.

(10) Patent No.: US 6,599,362 B2
(45) Date of Patent: Jul. 29, 2003

(54) CANTILEVER EPITAXIAL PROCESS

(75) Inventors: Carol I. Ashby, Edgewood, NM (US); David M. Follstaedt, Albuquerque, NM (US); Christine C. Mitchell, Albuquerque, NM (US); Jung Han, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 265 days.

(21) Appl. No.: 09/754,803

(22) Filed: Jan. 3, 2001

(65) Prior Publication Data

US 2002/0090816 A1 Jul. 11, 2002

(51) Int. Cl.$^7$ .............................................. C30B 25/04

(52) U.S. Cl. ............................. 117/94; 117/95; 117/97; 117/106; 117/952; 117/956

(58) Field of Search .................................. 117/952, 956, 117/94, 95, 97, 106

(56) References Cited

U.S. PATENT DOCUMENTS

| | | | | |
|---|---|---|---|---|
| 4,769,342 A | * | 9/1988 | Yagi et al. .................. 437/129 |
| 4,928,513 A | * | 5/1990 | Sugihara et al. ............. 73/1 G |
| 5,066,358 A | * | 11/1991 | Quate et al. ................. 156/647 |
| 5,158,907 A | | 10/1992 | Fitzgerald, Jr. ............. 437/126 |
| 5,455,419 A | * | 10/1995 | Bayer et al. ............. 250/423 F |
| 5,667,586 A | | 9/1997 | Ek et al. ........................ 117/84 |
| 5,909,036 A | | 6/1999 | Tanaka et al. ................. 257/94 |
| 5,970,314 A | | 10/1999 | Okahisa et al. ............... 438/47 |
| 6,051,849 A | | 4/2000 | Davis et al. ................. 257/103 |

OTHER PUBLICATIONS

Ashby, C., Mitchell, C., Han, J., Missert, N., Provencio, P., Follstaedt, D., Peake, G., and Griego, L., "Low–dislocation–density GaN from a single growth on a textured substrate," Appl. Phys. Lett., 2000, 77(20), 3233–3235.

Ambacher, O., "Review Article: Growth and application of Group III–nitrides," J. Phys. D: Appl. Phys., 1998, 31, 2653–2710.

Nam O., Bremser, C., Zheleva, T., and Davis, R., "Lateral epitaxy of low defect density GaN layers via organometallic vapor phase epitaxy," Appl. Phys. Lett., 1997, 71(18), 2638–2640.

Linthicum, K., Gehrke, T., Thomson, D., Tracy, K., Carlson, E., Smith, T., Zheleva, T., Zorman, C., Mehregany, M., and Davis, R., "Process routes for low defect–density GaN on various substrates employing pendeo–epitaxial growth techniques," MRS Internet J. Nitride Semicond. Res. 4S1, G4.9, 1999.

Zheleva, T., Smith, S., Thomson, D., Gehrke, T., Linthicum, K., Rajagopal, P., Carlson, E., Ashmawi, W., and Davis, R., "Pendeo–epitaxy– A new approach for lateral growth of gallium nitride structures," MRS Internet J. Nitride Semicond. Res. 4S1, G3.38, 1999.

Marchand, H., Ibbetson, J., Fini, P., Kozodoy, P., Keller, S., DenBaars, S., Speck, J., Mishra, U., "Atomic force microscopy observation of threading dislocation density reduction in lateral epitaxial overgrowth of gallium nitride by MOCVD," 1998, MRS Internet J. Nitride Semicond. Res. 3, 3, 1–7.

(List continued on next page.)

Primary Examiner—Robert Kunemund
(74) Attorney, Agent, or Firm—Elmer A. Klavetter

(57) ABSTRACT

A process of growing a material on a substrate, particularly growing a Group II–VI or Group III–V material, by a vapor-phase growth technique where the growth process eliminates the need for utilization of a mask or removal of the substrate from the reactor at any time during the processing. A nucleation layer is first grown upon which a middle layer is grown to provide surfaces for subsequent lateral cantilever growth. The lateral growth rate is controlled by altering the reactor temperature, pressure, reactant concentrations or reactant flow rates. Semiconductor materials, such as GaN, can be produced with dislocation densities less than $10^7/cm^2$.

21 Claims, 6 Drawing Sheets

OTHER PUBLICATIONS

Kapolnek, D., Keller, S., Vetury, R., Underwood, R., Kozodoy, P., Den Baars, S., Mishra, U., "Anisotropic epitaxial lateral growth in GaN selective area epitaxy," Appl. Phys. Lett., 1997,71(9), 1204–1206.

Kongetira, P., Neudeck, G., and Takoudis, C., "Expression for the growth rate of selective epitaxial growth of silicon using dichlorosilane, hydrogen chloride, and hydrogen in a low pressure chemical vapor deposition pancake reactor," J. Vac. Sci. Technol. B, 1997, 15(6), 1902–1907.

Haffous, S., Beaumont, B. and Gibart, P., "Effect of magnesium and silicon on the lateral overgrowth of GaN patterned substrates by metal organic vapor phase epitaxy," MRS Internet J. Nitride Semicond. Res. 3, 8, 1998.

Hiramatsu, K., Nishiyama, K., Motogaito, A., Miyake, H., Iyechika, Y. and Maeda, T., "Recent progress in selective area growth and epitaxial lateral overgrowth of III–nitrides: Effects of reactor pressure in MOVPE growth," Phys. Stat. Sol. (A), 1999, 176, 535–543.

Gehrke, T., Linthicum, K., Rajagopal, P., Preble, E., Davis, R., "Advanced Pendeoepitaxy™ of GaN and $Al_xGa_{1-x}N$ thin films on SiC(0001) and Si(111) substrates via metalorganic chemical vapor deposition," MRS. Internet J. Nitride Res., 2000, 551, W2.4.

Han, J., Ng. T., Biefeld, R., Crawford, M., Follstaedt, D., "The effect of $H_2$ on morphology evolution during GaN metalorganic chemical vapor deposition," Appl. Physics Letters, 1997, 71(21), 3114–3116.

* cited by examiner

CANTILEVER EPITAXIAL PROCESS

This invention was made with Government support under Contract No. DE-AC04-94AL85000 awarded by the Department of Energy. The Government has certain rights in the invention.

BACKGROUND OF THE INVENTION

The invention relates to a process for growth of materials on a substrate, and more particularly, to a process for epitaxial growth where the lateral and vertical growth rates of the material is controlled by processing conditions.

Nitride-based semiconductors have been shown to be useful as the material basis for devices such as light-emitting diodes and semiconductor lasers and laser diodes. Unfortunately, the development of materials, such as Group III–V materials, has been hampered by problems in the processing technology of such materials. For example, the difficulties in forming high-quality, single-crystalline Group III–V materials, such as GaN, over large areas are well known.

Group III–V materials tend to form dislocations and cracks easily when grown on non-lattice-matched substrates. High densities ($10^8$–$10^{10}$/cm$^2$) of threading dislocations have typically occurred in epitaxially-grown GaN materials when grown on lattice-mismatched substrates. The lack of large single-crystal GaN wafers has generally forced epitaxial growth of GaN and other Group III-N to be performed on substrates such as sapphire ($Al_2O_3$), SiC, $LiGaO_2$, Si(111), or other materials that can provide an orientational template for growth of the Group III-nitrides. The resulting epitaxial layers tend to be heavily dislocated. The existence of dislocations leads to remarkably deteriorated performance and results in a shortened service life. The dislocations increase the amount of nonradiative emission, reducing the light-emitting efficiency of light-emitting diodes and laser diodes made from these materials. These dislocations also shorten the functional device lifetime of laser diodes. Although threading dislocations have not prevented the development of high-brightness light-emitting diodes, the dislocations cause excessive reverse-bias leakage currents in p-n junction devices such as high-electron-mobility transistors, field-effect transistors and other electronic devices. Further, the dislocations lower the mobility of electrons and holes unfavorably, making it difficult to realize high-speed operation in electronic devices.

Substantial difficulties have been shown when attempting to obtain large-area crystals of any Group III-nitride that could provide suitable substrates for device fabrication. An attempt to utilize a single crystal of gallium nitride for a single crystal substrate has been reported in Jpn. J. Appl. Phys., Vol. 35 (1996), L77–L79. The size of the single crystal of gallium nitride synthesized was only up to about 2 mm square, which is too small to be of practical use in semiconductor operations.

One of the most important problems in the development of III-N devices is the lack of a lattice-matched substrate for growth of low-defect III-N layers. Sapphire (an aluminum oxide) and SiC have become the standard substrates of III-N growth, despite lattice mismatches of several percent. Such large mismatches lead to the formation of very high densities of threading dislocations ($10^9$/cm$^2$). To reduce the threading dislocation density with such substrates, two processes that involve III-N regrowth have been developed. Epitaxial lateral overgrowth (ELO), sometimes referred to as lateral epitaxial overgrowth (LEO), and pendeo-epitaxy (PE) are two regrowth techniques that take advantage of the faster growth of GaN in the [11$\bar{2}$0] direction to produce lower dislocation densities (less than approximately $10^7$/cm$^2$). Nam et al. (O. Nam, M. Bremser, T. Zheleva, and R. Davis, Appl. Phys. Lett., 71(18), 1997, 2638–2640) describe the production of III–V semiconductor materials using ELO. This ELO method requires an initial growth of a III-N layer on a substrate, removal from the growth reactor, ex-situ processing, deposition of dielectric masks, and re-insertion into the growth reactor. Various etching and other processing steps are included. In Nam et al., an AlN buffer layer was deposited on a SiC substrate, followed by deposition of a GaN film, followed by $SiO_2$ mask patterning, followed by lateral epitaxial overgrowth of the GaN layer. Lateral overgrowth was achieved at a temperature of 1000–1100° C. The lateral growth rate relative to the vertical growth rate is controlled by the reactor temperature, pressure, reactant concentrations and flow rates and can be estimated by development of semiempirical expressions for a given reactor system (Kongetira, P., Neudeck, G. W., Takoudis, C. G., J. Vac. Sci Technol. B, 1997, 15(6), 1902–1907).

As with the ELO method, the pendeo-epitaxial method, described by Linthicum et al. (K. Linthicum, T. Gehrke, D. Thomson, K. Tracy, E. Carlson, T. Smith, T. Zheleva, C. Zorman, M. Mehregany, and R. Davis, MRS Internet J. Nitride Semicond. Res. 4S1, G4.9, 1999) and Zheleva et al. (T. Zheleva, S. Smith, D. Thomson, T. Gehrke, K. Linthicum, P. Rajagopal, E. Carlson, W. Ashmawi, and R. Davis, MRS Internet J. Nitride Semicond. Res. 4S1, G3.38, 1999), requires an initial growth of a III-N layer on a substrate, removal from the growth reactor, ex-situ processing, and re-insertion into the growth reactor. In the PE method, lateral growth of GaN films suspended from (11$\bar{2}$0) side walls of (0001) oriented GaN columns into and over adjacent etched wells has been achieved via metal-organic vapor phase epitaxy (MOVPE) without the use of, or contact with, a supporting mask or substrate. Although not requiring the use of a $SiO_2$ mask as with ELO, the pendeo-epitaxial method requires the growth of the seed GaN layer on a substrate, removal from the growth reactor for selective etching to form substrate columns and trenches in the substrate and growth of the epitaxial GaN layer. This method also has growth off a high-dislocation density substrate.

DETAILED DESCRIPTION OF THE INVENTION

The present invention provides a process of producing epitaxially-grown materials using fewer processing steps than conventional processing methods and, in the case of semiconductor materials, producing materials with relatively few defects. The materials that can be grown by the method of the present invention include Group III–V materials, Group II–VI materials, and materials including SiGe. The Group III–V materials include at least one of the Group III elements B, Al, Ga, In and Tl and at least one of the Group V elements N, P, As, and Sb; combinations within each set of elements can be used. The Group II–VI materials include at least one of the Group II elements Zn, Cd, and Hg and at least one of the Group VI elements O, S, Se, and Te; combinations of the elements can be used.

The process of the present invention, referred hereafter as cantilever epitaxy (CE), is a single-growth process that uses specially patterned substrates to capitalize on the dependence of dislocation density on the lateral dimension of the growth surface to produce dislocation densities that are as low or lower than those produced by ELO or PE over the entire patterned region of the substrate (Ashby, C., Mitchell, C., Han, J., Missert, N., Provencio, P., Follstaedt, D., Peake, G. and Griego, L., 2000, Appl. Physics Letters, 77(20), 3233–3235; incorporated herein by reference).

The materials are grown on a substrate where the substrate material can be any commonly-used substrates such as an aluminum oxide material such as sapphire, SiC, Si (111), ZnO, MgO, LiGaO$_2$ (lithium gallate), GaAs, MgAl$_2$O$_4$, Group III–V materials and Group II–VI materials, with the Group II, Group III, Group V and Group VI elements as previously described.

Figure 1:
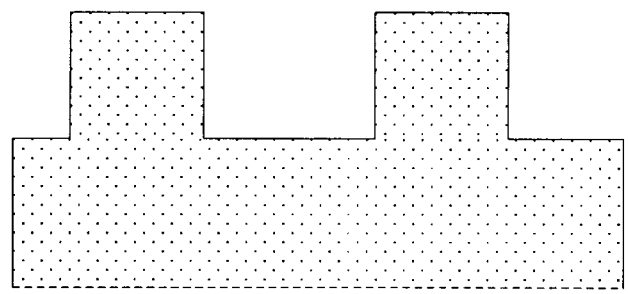
FIG. 1 shows an illustration of one embodiment of a patterned substrate according to the process of the present invention.
Figure 2:
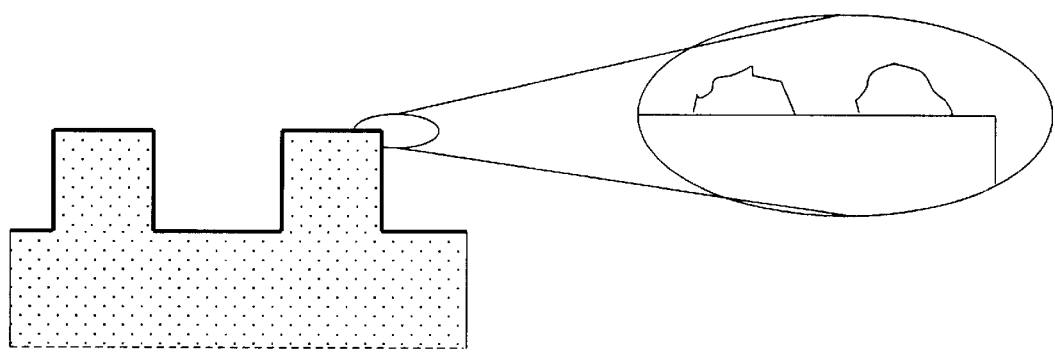
FIG. 2 shows an illustration of a patterned substrate with a nucleation layer.

The first step in the process of the present invention is patterning of the substrate to provide at least one elevated cantilever support region from which to initiate the cantilever epitaxial process. Generally, multiple cantilever support regions, and corresponding trenches, are patterned. The patterning etches out portions of the substrate to produce the cantilever support regions and corresponding trenches, as illustrated in FIG. 1. The second step is growth of a thin nucleation layer of sufficient thickness to permit subsequent growth of a coalesced single-crystal or nearly single-crystal layer on top of the nucleation layer, as depicted in FIG. 2. The formation of a nucleation layer on a substrate is well-known in the art (Ambacher, O., J. Phys. D: Appl. Phys. 1998, 31, 2653–2710). Advantageously, this step and subsequent processing steps used to produce the desired material can all take place in the growth reactor without removal between processing steps. Hereinafter, processing without removal from the reactor is referred to as in situ processing. Optionally, the substrate with the grown nucleation layer can be removed from the reactor and then replaced in the same reactor or a different reactor for subsequent in situ processing, with the remaining growth processing steps therefore occurring in that reactor without further removal between the remaining processing steps. Conveniently, this nucleation layer can be of the same composition as the material that is desired to be grown but can also be any material that serves as nucleation sites for subsequent material growth. For example, if the material desired to be grown is a Group III–N material, the nucleation layer can be any of the Group III–N materials or can be a non-nitride material, including such materials as ZnO, AlAs, and Si/N (nitrided silicon surface). The nucleation layer is generally grown to a thickness less than approximately 0.1 μm on the surface of the patterned substrate. This nucleation layer results generally in a noncontinuous layer of the nucleation material.

Figure 3A:
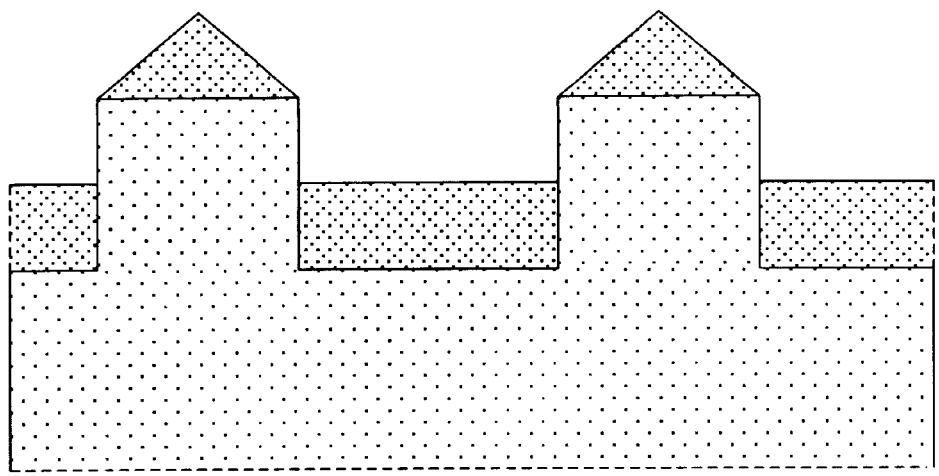
FIGS. 3a to 3d show illustrations of four embodiments of different geometries of the middle layer grown according to the process of the present invention.
Figure 3B:
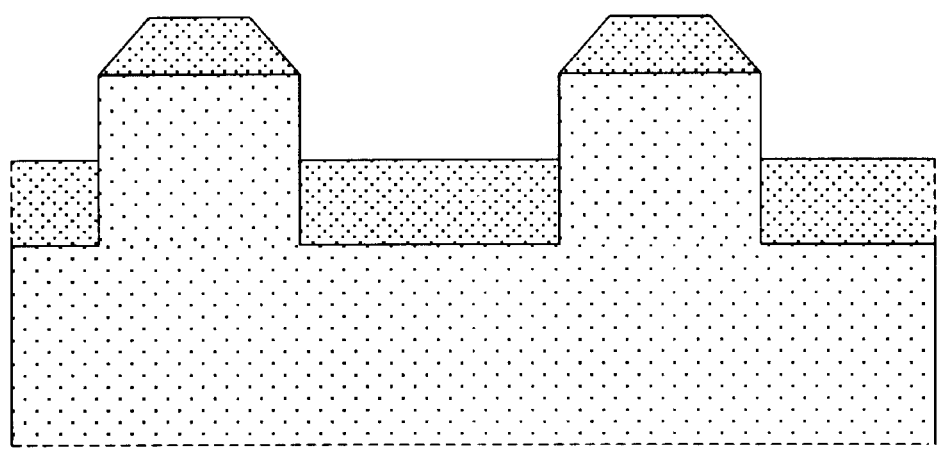
Figure 3C:
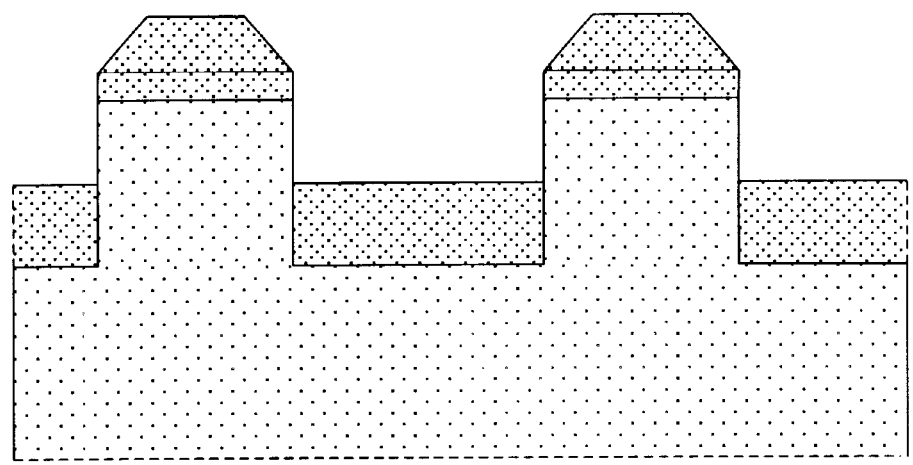
Figure 3D:
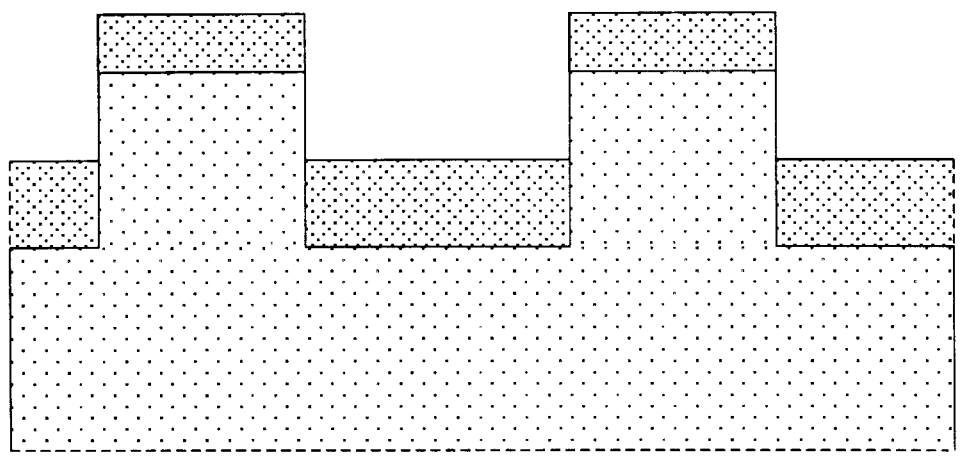
Figure 4A:
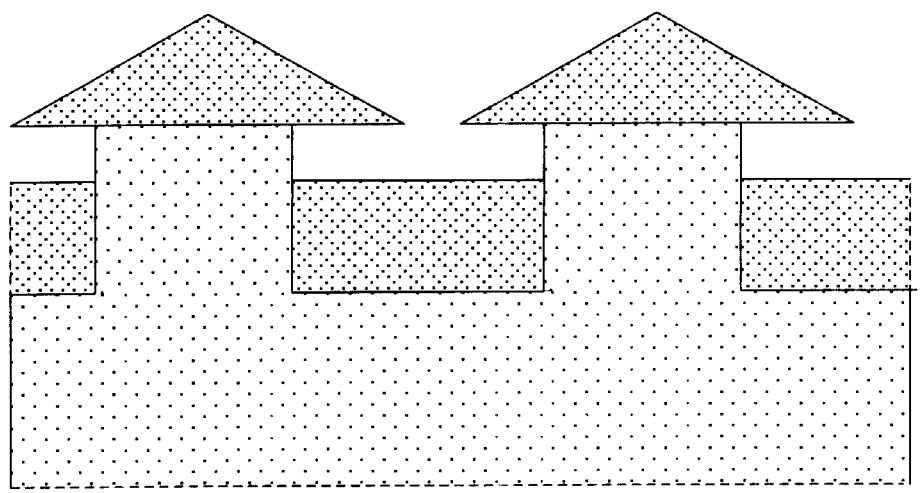
FIGS. 4a to 4d show illustrations of four embodiment of different geometries of the middle layer with subsequent cantilever growth.
Figure 4B:
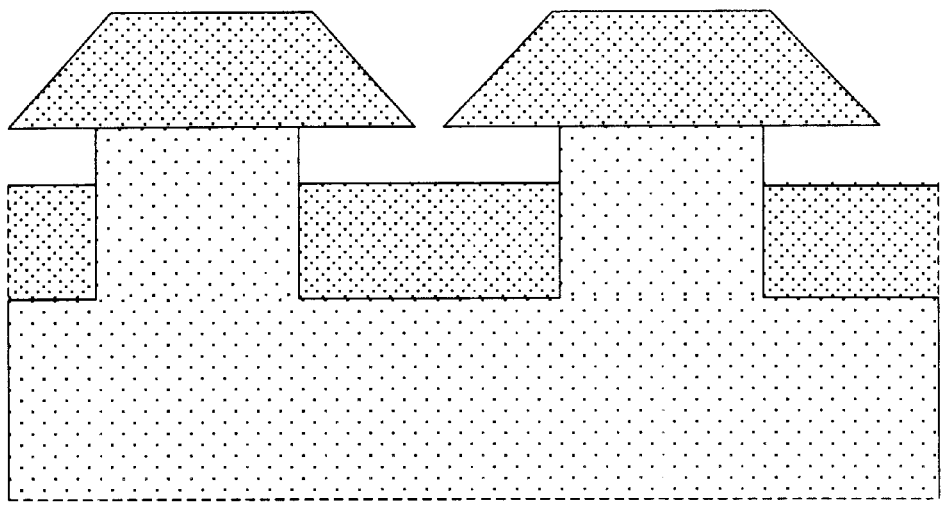
Figure 4C:
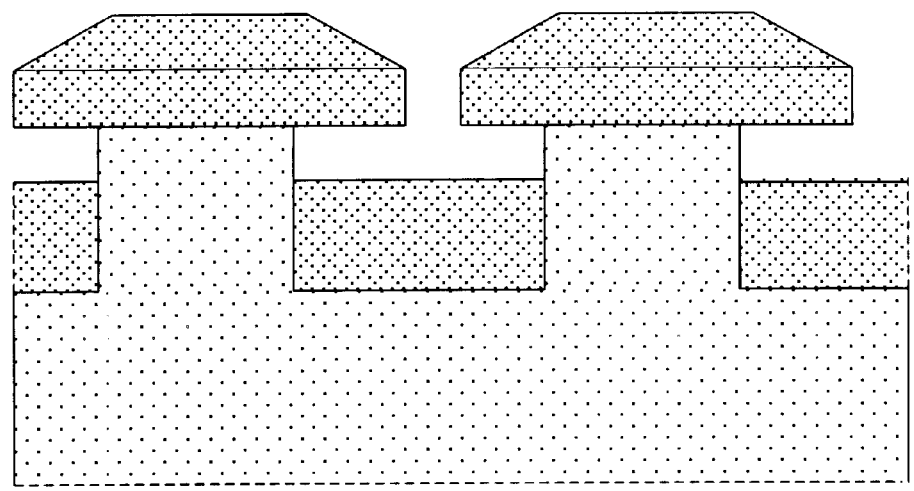
Figure 4D:
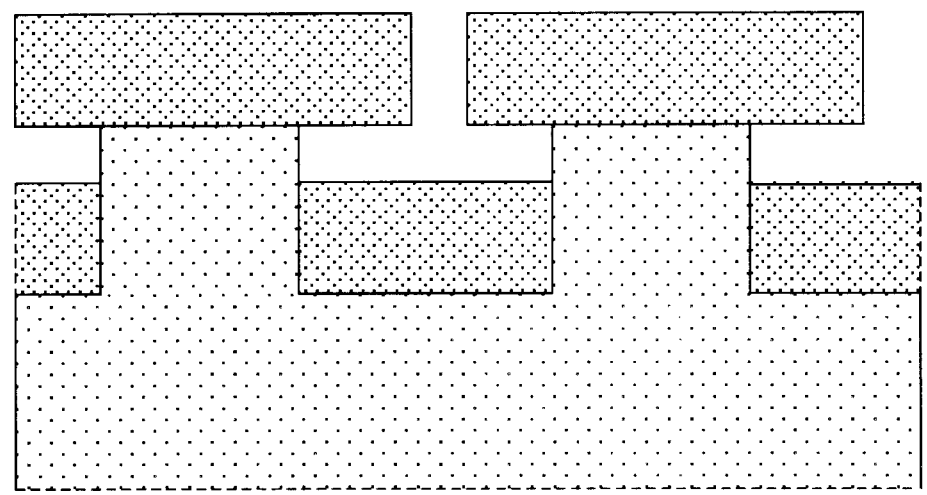

The next step is growth of another material layer, hereinafter referred to as the middle layer, on top of the nucleation layer, as depicted in FIG. 3a–d. Various geometries can be grown on the cantilever support regions, depending on the materials and operating conditions used, including a pyramidal geometry (FIG. 3a), a trapezoidal geometry (FIG. 3b), a combination plateau/trapezoidal geometry (FIG. 3c) and a plateau geometry (FIG. 3d). Although not required, this middle layer is generally grown to a thickness less than the depth of the trenches in the patterned substrate. The middle layer can be any suitable growth material that can be grown on the nucleation layer but can conveniently be of the same material as the material that is desired to be subsequently grown. A substantial thickness of this layer is generally not grown as this layer will have a relatively high dislocation density. The purpose of the middle layer is to provide surfaces from which subsequent lateral cantilever of the desired material occurs (i.e., the growth material). In the cantilever process of the present invention, once growth of this middle layer begins, the processing is exclusively in situ, meaning that the substrate with the growth materials remain in the vapor-phase growth reactor during the middle layer growth processing step and the remaining growth material processing step. Optionally, all three processing steps (formation of the nucleation layer, middle layer, and the final desired material) can occur without removing the substrate from the reactor.

Figure 5:
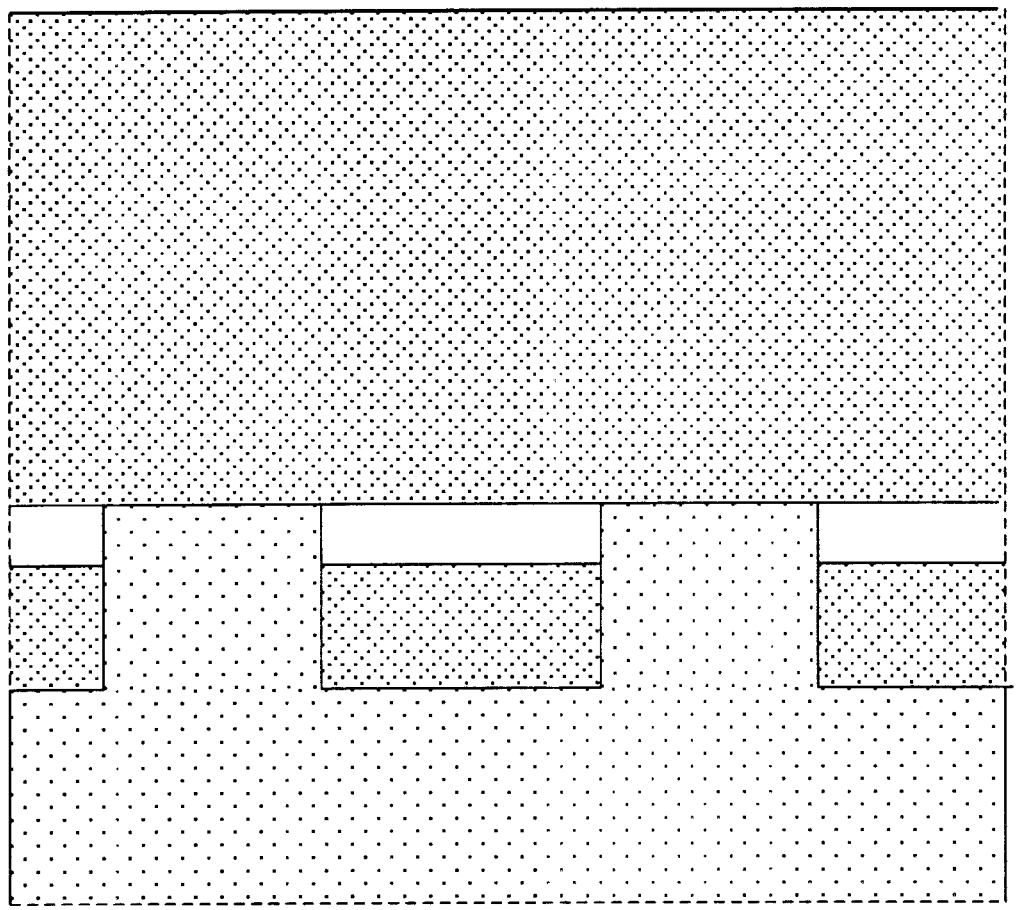
FIG. 5 shows an illustration of the growth layer according to the process of the present invention of cantilever growth.

In the processing step to produce the material desired to be grown (the growth material), depicted in FIG. 4a–d (corresponding to the middle layer geometries of FIG. 3a–d), the growth material is grown under conditions that generally promote more rapid growth in a direction parallel to the substrate surface (that is, lateral growth of the cantilever) than in the direction perpendicular to the substrate surface (that is, vertical growth relative to the cantilevers). The growth of the material is performed by standard vapor-phase growth techniques well known in the art, such as by metalorganic chemical vapor deposition (MOCVD), organometallic vapor-phase epitaxy (OMVPE), halide vapor-phase epitaxy (HVPE), molecular beam epitaxy (MBE) and other vapor-phase growth techniques (Ambacher, O., J. Phys. D: Appl. Phys. 1998, 31, 2653–2710). The growth material grows both from the trenches and from the surfaces formed by the middle layer growth. In a typical growth pattern, the lateral cantilever growth from the surfaces of the middle layer continues until the lateral growth from one elevated cantilever support region coalesces with the lateral growth from an adjacent cantilever support region, with the lateral growth rate relative to the vertical growth rate controlled by processing conditions such that the vertical growth from the trench between the two adjacent cantilever support regions does not intersect the coalescing lateral growth of the growth material (see FIG. 5). Once the growth material coalesces, the vertical growth in the trenches stops because no additional reactants can access the trench regions. Subsequent vertical and lateral growth of the growth material can occur, producing high-quality material with a low dislocation density, a large areal extent and high thickness (FIG. 5).

Unlike the ELO or PE methods, the process of the present invention does not require removal from the reactor for processing prior to a second growth step (regrowth) that produces the lower dislocation-density material. Therefore, there is no intermediate step between growing the middle layer and initiating the growth layer for which the substrate is removed from the reactor. Additionally, no mask is utilized during the actual growth of the material. This is contrary to ELO methods in which dielectrics and metals, such as tungsten, are employed as ELO masks.

In the first step involving patterning of the substrate, the substrate can be any of the previously noted substrate materials or any other substrate material suitable for material growth, as known in the art. In one embodiment, an etch mask incorporating the desired pattern to the substrate is applied. This is the most common method for developing a patterned substrate. This mask is typically a photoresist (PR) that is selected to provide pattern definition during the etching of the substrate. For relatively shallow etched depths of the trenches (less than approximately 5 micrometers), a simple PR mask is sufficient. For deeper substrate etching, as would be required for spanning greater than approximately 50 micrometer spaces between etched cantilever support features, typical commercial PR formulations will be eroded away before the desired etch depth is achieved. For such deep features, a metal or dielectric mask technology, as is known to those skilled in the art, could be employed. The resist is selected to provide the desired feature resolution for the desired etch depth. Other resist technologies using self-assembled patterns, ultrahigh resolution patterning or lithographic approaches can also be utilized. The pattern defined on the substrate will depend on the application but will always be some combination of cantilever support regions and corresponding trenches between these regions, with the number of support regions and trenches, and relative dimensions, varying depending on the application. In one embodiment, a single cantilever support region can be patterned on a substrate for subsequent cantilever growth.

The pattern of the elevated cantilever support regions (or posts) is etched into the substrate. For sapphire ($Al_2O_3$), this can be performed in a high-density-plasma etcher using a Cl-based chemistry, such as with $BCl_3$ as the Cl-source. Other etch chemistries based on Cl or another species could be employed. The specific etch chemistry employed should not be restricted and the most suitable choice will be determined by the state of the art for a particular substrate material. Patterning of Si(111) can use an F-based plasma chemistry and the SiC can use a plasma chemistry with both F and O as active species. However, other chemistries are possible for these materials. An inductively coupled plasma (ICP) etch tool can be used, as well as any type of etching device or method capable of etching a sufficiently deep pattern.

A variety of etched substrate patterns can be employed for cantilever epitaxy (CE). The specific orientation of features within the mask pattern and of the mask pattern with respect to the crystal axes of the substrate will depend on the detailed chemistry and crystallography of the particular material to be grown by CE. Feature shapes and orientations are selected to permit lateral cantilever growth. In the general process of the present invention, the lateral cantilever growth is at a rate faster than the vertical growth; however, in some applications, the lateral growth from the middle layer grown onto the substrate can be at a rate less than the vertical growth rate provided that the lateral growth is completed prior to coalescence of the vertical growth from the trench regions with the lateral growth from the cantilever support regions.

For the example of GaN on sapphire, successful cantilever growth to coalescence has been demonstrated using types of substrate patterns that include (1) an array of alternating support lines and etched troughs that were aligned parallel to the sapphire [$11\bar{2}0$] or [$1\bar{1}00$] family of crystallographic directions, (2) an array of alternating etched troughs and support rectangles whose sides were aligned parallel to the sapphire [$11\bar{2}0$] and [$1\bar{1}00$] family of crystallographic directions, (3) an array of alternating parallelograms whose sides were aligned parallel to either the [$11\bar{2}0$] or [$1\bar{1}00$] crystallographic directions to define 30 or 60 degree vertex angles. Various dimensions of the cantilever support regions and trenches have been used. To minimize dislocation density in GaN, it is desirable to have support features whose width in one direction is of the order of one micrometer or less. The dimension of the support feature in the other direction is essentially unlimited except by the maximum dimension of the substrate itself.

If dislocation minimization is not essential for a cantilever application, no specific limits on the lateral dimensions of the support features apply. Support dimensions and overall placement on the substrate is then determined by the specific final cantilever structure that is desired. When free cantilevers are desired, there is no maximum support spacing. When coalescence of two oppositely growing cantilevers is desired, the maximum etched trough depth will determine the optimum range of trough widths when coalescence over a trapped or untrapped gaseous volume is desired. The specific trough depth-to-width ratio will depend on the specific relative vertical-to-lateral growth rate ratio for a specific material. In the case of GaN, lateral-to-vertical growth rate ratios of the order of ten to one have been demonstrated under the reactor conditions employed.

In one embodiment, cantilever support feature depths are selected to insure that the lateral growth rate of the cantilever was sufficiently fast to produce the coalescence of two opposing cantilevers before the vertical growth of the material in the trench region between the supports became thicker than the initial etched depth. This ensures that material grown in the trenches does not contact the cantilever material. For relatively small spans of less than approximately 5 micrometers, an etch depth of approximately 1 micrometer was found to be sufficient. For some applications, the etched pattern will be selected to permit coalescence of cantilevers growing off different supports. For other applications, free-hanging cantilevers will be desired and growth would be terminated before coalescence. The particular application will determine suitable etch depths and support spacings. For very low dislocation densities over the support region, narrow supports are advantageous to control the dislocation density.

Any remaining mask is removed from the substrate surface to expose the original substrate surface after patterning is completed and before growth begins. The removal process depends on the masking material employed, but follow procedures known to those skilled in the art.

Extensive studies have shown that the depth of the trench regions, the width of the trench regions, and the width of the cantilever support regions, as well as the relationship between the dimensions of these regions is not critical in achieving high-quality materials with low vertical dislocation densities. However, a cantilever support region width that permits development of an angled facet over most, if not all, of the cantilever support surface before initiating lateral cantilever growth (such as by increasing temperature, decreasing pressure or altering reactant concentrations) for growth of a Group III–V material can be used to redirect the vertical threading dislocations into horizontal dislocations. Although the concentration of horizontal dislocations at heights below the apex of the angled facet is still relatively high, above the apex, horizontal dislocations are relatively low, because most of the horizontal dislocations are being formed either at the support region edge, or by redirection of vertical ones. Once all the vertical dislocations were turned horizontal, there is not significant generation of additional horizontal threading dislocations with continued growth. Once all the vertical threading dislocations propagating upward from the middle layer are turned to horizontal, additional material grown above this height is essentially dislocation free.

After patterning of the substrate occurs, the substrate is inserted into the growth chamber (reactor) and all subsequent processing steps occur without removal of the substrate from the growth chamber. Importantly, no masks are required in any processing step after the patterning of the substrate occurs; all further processing steps are mask-free. The substrate is cleaned in the growth chamber and the surface prepared for growth. One typical pre-growth treatment involves heating in ambient $H_2$ for less than approximately 10 minutes.

After the pretreatment, the nucleation layer, made from a material selected from Group III–V materials, Group II–VI materials, and SiGe, is grown on the substrate in a mask-free processing step. For example, a low to moderate temperature growth (400–700° C.) of a nitride material, commonly GaN, AlGaN, or AlN, is grown on the substrate surface as a nucleation layer. A thickness of approximately 100–300 Å is typical for a sapphire substrate. Use of a different substrate material, such as SiC or Si(111), would result in use of the nucleation layer composition and thickness typically used for that particular substrate material.

The middle layer, made from a material selected from Group III–V materials, Group II–VI materials, and SiGe, possibly but not necessarily the same material as the nucleation layer material, is grown to a thickness sufficient to produce a more or less continuous layer on the patterned surface in this mask-free processing step. In one embodiment, where the middle layer is a GaN material, the growth occurred at a temperature of approximately 1050° C. in a low-pressure MOCVD reactor and a thickness of approximately 0.4 µm was found to be sufficient to provide a more or less continuous layer. The middle layer grown can result in an angled geometry (hereinafter also referred to as a pyramidal geometry), as shown in FIG. 3a (Haffouz, S., Beaumont, B., and Gibart, P., MRS Internet J. Nitride Semicond. Res., 1998, 3(8), 1–6), a trapezoidal geometry (FIG. 3b), a combination plateau/trapezoidal geometry (FIG. 3c), or a plateau geometry (see FIG. 3d) on top of the cantilever support regions. The geometry depends on the reactor operating conditions as well as on the characteristics of the material used.

Given that all other reactor conditions remain approximately constant, the cantilever epitaxy process of the present invention can often initiate preferential lateral growth by increasing the operating temperature, particularly for Group III–V materials. The general requirement for the chosen operating conditions is that the rate of lateral growth of the desired material is approximately equal to or greater than the rate of vertical growth. The temperature can be increased, or other operating conditions (such as pressure, reactant concentration ratios, or reactant flow rates) altered, to enhance the lateral/vertical growth rate ratio.

In one embodiment where the method of the present invention is utilized but the lateral growth rate can be slightly lower than the vertical growth rate is where the trench depth is of a sufficient value such that lateral cantilever growth occurs from the cantilever supports but the lateral growth is stopped prior to the point where the vertical growth from the trenches intersects, or coalesces into, the laterally growing cantilever material. Such a growth process can be desired in applications such as for membranes where high-quality lateral growth of material is required rather than large thicknesses of high-quality material or for applications where a freely suspended cantilever is desired. In this embodiment, cantilever epitaxial growth still occurs but the lateral growth rate in this embodiment can be less than the vertical growth rate in this growth process.

In another embodiment, a sapphire substrate and a GaN buffer layer were used, with trimethy gallium (TMG) and ammonia as source gases, a V/III gas ratio (Ga/N ratio) of between approximately 1000–2000, and a pressure of approximately 100–200 Torr. A pattern defining etch mask was applied to a sapphire substrate with a (0001) surface. Other substrate materials could equally well be used for the process. The pattern was etched into the substrate to a sufficient depth that subsequent growth of III-N vertical to the original (0001) etched surface would be thin enough that the more rapid lateral growth produced a cantilever structure extending out from the substrate support to the required distance without interference from the III-N growing in the etched region. The particular method employed for this etching is determined by the substrate material and can employ any current or future method for etching said material.

After a GaN nucleation layer was put on the surface, a middle layer of GaN was grown. The nucleation layer was put on the surface in the same reactor that serves as the growth reactor for subsequent steps, thus providing a process where the substrate remains in the reactor over the entire growth process with no removal steps from the reactor. Alternatively, the nucleation could be put on the substrate surface outside of the growth reactor, and then put into the growth reactor where all subsequent growth steps occur. Lateral growth in a low to ambient pressure MOCVD reactor to produce GaN materials typically is performed between 950° C. and 1200° C. Source gases are chosen to provide the necessary Group III and Group V elements. For a Ga—N material, potential Ga source gases include, but are not limited to, trimethyl gallium (TMG) and triethyl gallium (TEG); potential nitrogen source gases include, but are not limited to, ammonia, hydrazine, nitrogen, and a substituted ammonia. The pressure is typically between approximately 10 Torr and 1 atmosphere. The V/III gas ratio is generally approximately 500–10,000 with the typical value in the approximate range of 1000–2000. Note that the specific combination of gases, V/III ratio, pressure, and temperature that are best for CE are interdependent variables and can also depend on the specific reactor configuration. The growth was performed at the operating conditions sufficient to ensure that the lateral growth rate is higher than the vertical growth rate until a layer was grown of desired thickness. A threading dislocation density of less than approximately $10^7/cm^2$ was achieved.

For a temperature greater than approximately 1050° C. under the conditions of source gases, V/III ratio, and pressure employed the lateral/vertical growth rate ratio exceeded 1. In this embodiment, the middle layer growth was performed at approximately 1050° C. until about 0.4 micrometers were grown, then the temperature was increased to approximately 1100° C. to enhance the lateral/vertical growth rate ratio and produce the cantilevers. The vertical growth rate was approximately 2 micrometers/hr at 1100° C. Growth proceeded to coalescence and additional growth on top of the coalesced cantilevers was performed to demonstrate the CE according to the process of the present invention.

EXAMPLES

Example 1

Preparation of Substrate

A c-plane sapphire substrate was prepared using conventional photolithography techniques with a series of line patterns that had varying fill factors. Nickel (Ni) was thermally evaporated using an e-beam system onto the sapphire substrate to a thickness of approximately 0.2–0.5 µm. This was then patterned with standard photolithography techniques and the exposed Ni was sputtered away. This procedure left a photoresist (PR) coated Ni mask consisting of arrays of lines with fill factors varying from 0.01 to 0.7. A nickel mask was used due to its superior resistance to the plasma etch of the sapphire substrate. The patterns are defined as p:t where p is the width of the cantilever support region (or nucleation post) in micrometers and t is the width of the adjacent trench in micrometers. The fill factor is defined as p/p+t, the nucleation zone divided by the pitch. The trench was etched into the substrate by a high-density-plasma etcher using a chlorine-based chemistry with $BCl_3$ as the chlorine source. The substrate regions were masked for trenches of approximately 2–30 micrometers in width and cantilever support posts approximately 1–8 micrometers wide. An etch depth of 1–2 micrometers was used. The strong ionic component of the plasma etch produced cantilever supports with slightly angled sidewalls. The result of this etch was that for a 4:8 pattern the actual post width was 2.8 micrometers at the top and 4.1 micrometers at the bottom. The trench also reflected these width changes and was slightly wider at the top (~9 micrometers) and narrower at the bottom. After the plasma etching any remaining PR was removed using acetone and an oxygen plasma cleaning and any remaining Ni was removed using a nitric acid ($HNO_3$) wet etch.

Example 2

Growth GaN Cantilever Epitaxy

The substrate was inserted into a high speed rotating disk MOCVD growth chamber (Han, J. et al., Appl. Physics Letters, 1997, 71(21), 3114–3116). The substrate was cleaned and the surface prepared for growth in-situ by heating the wafer to 1080° C. at 50 Torr flowing 10 liters/minute $H_2$ for 5 minutes. This in-situ surface preparation can vary from 1 to 10 minutes or more and a nominal amount of substrate etching does occur. This etching decreases the total depth of the trenches and has to be accounted for in the growth planning. This was then followed with a substrate nitridization process. The reactor temperature was lowered to 750° C. at 50 Torr with an ammonia ($NH_3$) flow rate of 4.5 slpm and a hydrogen flow rate of 1.9 slpm for a total of 2 minutes. This nitridization step has not been shown to be critical for the subsequent GaN growth and can be omitted. A low temperature (LT) GaN nucleation layer was grown on the prepared sapphire substrate to a thickness of approximately 200–300 Å at a temperature of 550° C., a reactor pressure of 140 Torr, and took 110 sec. The trimethylgallium (TMG) flow rate into the reactor was 1.10 sccm with $NH_3$ and $H_2$ flow rates of 6 slpm and 6.3 slpm, respectively. This LT buffer layer was then annealed while the reactor was heating up to the next growth temperature of 1050° C. under only $NH_3$ and $H_2$ flow. The first layer of high temperature (HT) GaN growth was performed at approximately 1050° C. for 0.4 µm of vertical growth. The planar growth rate at this step is approximately 2 µm/hr. The TMG flow rate was 3.60 sccm into the reactor with $NH_3$ and $H_2$ flow rates of 6 slpm and 6.3 slpm, respectively. After the GaN growth at 1050° C., the temperature was increased to approximately 1100° C. to enhance the lateral/vertical growth rate ratio and produce the cantilevers. The planar growth rate at 1100° C. is slightly slower than at 1050° C., approximately 1.8 µm/hr. The flow rates of gases were the same as for the first HT growth step.

Several experiments were completed with different total planar thicknesses. In one experiment, the GaN material was grown to a thickness of 0.9 micrometers and, in another experiment, the GaN material was grown to a thickness of 2.2 micrometers, with the samples characterized using scanning electron microscopy (SEM), transmission electron microscopy (TEM), atomic force microscopy (AFM), and cathodoluminescence (CL).

In both cases, the top and bottom surfaces of the formed cantilever GaN material were essentially flat, with the cantilever tilt being $\leq 0.1°$, as determined by AFM. A significant portion of the coalescence front was essentially free of threading dislocations (on a 100 square micrometer scale, there were less than approximately $10^7/cm^2$ dislocations), as observed by TEM and CL. Advantageously in the process of the present invention, cantilever epitaxy involves Group III-N directly on the sapphire substrate without the use of a dielectric mask used in ELO. Consequently, gas-phase diffusion growth-rate enhancement does not occur and no fill-factor effects are present.

The results from SEM and TEM show that there is not a strong dependence on the final appearance of coalesced CE-grown GaN that was initiated from either the $\{11\bar{2}0\}$ or $\{1\bar{1}00\}$ GaN planes. In a TEM of a cantilever structure with an 8:4 pattern, no vertical threading dislocations were observed in the cantilevers. Occasionally threading dislocations are seen at the coalescence front. Regions near the edge of the support posts show a reduced number of threading dislocations when compared to directly above the center of the sapphire post.

AFM is a commonly accepted way to look at threading dislocations in GaN films. Threading dislocations appear as shallow surface depressions and/or step terminations in the GaN film and some tend to create spirals about themselves. For one particular CE experiment with a 1:4 pattern, only 2 dislocations were seen over a 10 µm×10 µm area. This corresponds to approximately $2 \times 10^6$ dislocations/$cm^2$. This is a significant improvement over an ELO structure with the same pattern, which would show an large amount of threading dislocations both in the nucleation region and at the coalescence front.

Our growth procedures for CE commonly use trimethylgallium (TMG) and trimethylaluminum (TMA) for group III sources and ammonia ($NH_3$) for a group V source. Other commonly used group III sources are, but not limited to, triethylgallium (TEG) and triethylaluminum (TEA). CE can also be grown with doped materials. Common doping sources for this system are, but not limited to, bis (cyclopentadienyl) magnesium for p-type magnesium doping and silane for n-type silicon doping.

Example 3

Growth of AlGaN CE

For AlGaN CE the sapphire substrate was patterned in the same manner as for GaN CE. The in-situ substrate preparation was also the same as for GaN CE. For $Al_{0.2}Ga_{0.8}N$, only one HT growth step was used. The HT AlGaN was grown at 1080° C. and 140 Torr with TMG and TMA flow rates of 3.04 sccm and 0.38 sccm, respectively. The $NH_3$ and $H_2$ flow rates were 6.0 slpm and 6.3 slpm, respectively. The results from this AlGaN CE experiment show significant lateral overgrowth and coalescence for various patterns.

Example 4

Growth Using Angled Facets

In another embodiment with conditions similar to those described in Example 1, 1-micrometer posts were used and 1 micrometer of middle layer was grown, with a 1-micrometer-support and 4-micrometer trench pattern that showed only 2 vertical threading dislocations in a 10×10 micrometer AFM image, corresponding to $2 \times 10^6$ dislocations/$cm^2$. The middle layer in this embodiment formed fully developed angled facets over the support, before initiating cantilever growth.

The invention being thus described, it will be apparent that the same may be varied in many ways. Such variations are not to be regarded as a departure from the spirit and scope of the invention, and all such modifications as would be obvious to one skilled in the art are intended to be included within the scope of the following claims.

We claim:

1. A process for cantilever growth of a material, comprising:
    etching a pattern onto a substrate, said pattern comprising at least one cantilever support region;
    forming a nucleation layer on said substrate;
    growing in a reactor by a vapor-phase growth technique a middle layer on said nucleation layer on said substrate, said middle layer providing surfaces for subsequent lateral cantilever growth;
    growing in said reactor without an intermediate removal step on said middle layer a growth layer of material with a lateral growth rate of the growth layer approximately equal to or greater than the vertical growth rate relative to the orientation of the substrate, said middle layer remaining maskless.

2. The process of claim 1 wherein the substrate is a material selected from an aluminum oxide material, SiC, Si(111), ZnO, MgO, LiGaO$_2$, GaAs, a Group III–V material, and a Group II–VI material.

3. The process of claim 1 wherein said vapor-phase growth technique is selected from metalorganic chemical vapor deposition, organometallic vapor-phase epitaxy, molecular beam epitaxy, and halide vapor-phase epitaxy.

4. The process of claim 1 wherein the nucleation layer is selected from Group III–V materials, Group II–VI materials, and SiGe, wherein the Group III materials include at least one of B, Al, Ga, In and TI, the Group V materials include at least one of N, P, As, Sb, the Group II materials include at least one of Zn, Cd, Hg, and the Group VI materials include at least one of O, S, Se, and Te.

5. The process of claim 1 wherein the middle layer is selected from Group III–V materials, Group II–VI materials, and SiGe, wherein the Group III materials include at least one of B, Al, Ga, In and TI, the Group V materials include at least one of N, P, As, Sb, the Group II materials include at least one of Zn, Cd, Hg, and the Group VI materials include at least one of O, S, Se, and Te.

6. The process of claim 1 wherein the growth layer is selected from Group III–V materials, Group II–VI materials, and SiGe, wherein the Group III materials include at least one of B, AL, Ga, In and TI, the Group V materials include at least one of N, P, As, Sb, the Group II materials include at least one of Zn, Cd, Hg, and the Group VI materials include at least one of O, S, Se, and Te.

7. The process of claim 6 wherein the growth layer is a Group III–V material wherein the Group III materials include at least one of B, Al, Ga, In and TI, and the Group V materials include at least one of N, P, As, Sb.

8. The process of claim 7 wherein the dislocation density is less than approximately $10^7$/$cm^2$.

9. The process of claim 1 wherein the surfaces provided by the middle layer form a plateau geometry.

10. The process of claim 1 wherein the surfaces provided by the middle layer form a pyramidal geometry.

11. The process of claim 1 wherein the lateral growth rate and the vertical growth rate are controlled by altering reaction process conditions, said reaction process conditions selected from temperature, pressure, reactant concentrations, and reactant flow rates.

12. The process of claim 1 comprising the further step of growing an additional growth layer on top of the existing growth layer.

13. The process of claim 7 wherein the growth layer is a Group III-N material wherein the Group III materials include at least one of B, Al, Ga, In and TI.

14. The process of claim 13 wherein the nucleation layer is a Group III-N material, the middle layer is a Group III-N material and the growth layer is a Ga—N material, said Ga—N material having a dislocation density less than approximately $10^7$/$cm^2$.

15. The process of claim 14 wherein the nucleation layer is less than approximately 500 angstroms thick and the middle layer is less than approximately 1 micrometer thick.

16. A process for cantilever growth of a Group III-N material, comprising:
    etching a pattern onto a substrate, said pattern comprising at least one cantilever support region;
    forming a nucleation layer on said substrate, said nucleation layer selected from a Group III-N material;
    growing in a reactor by a vapor-phase growth technique a Group III-N middle layer on said nucleation layer on said substrate, said middle layer less than approximately 1 micrometer in thickness and providing surfaces for subsequent lateral cantilever growth;
    growing in said reactor at approximately 1100° C. without an intermediate removal step on said middle layer a growth layer of a Group III-N material with a lateral growth rate of the growth layer approximately equal to or greater than the vertical growth rate relative to the orientation of the substrate, said middle layer remaining maskless.

17. The process of claim 16 wherein the growth layer is selected from a Ga—N material, an AlGaN material, an InGaN material and an AlGaInN material.

18. The process of claim 16 wherein the processing steps of growing the nucleation layer, growing the middle layer, and growing the growth layer occur without removal of the substrate from the reactor.

19. A process for cantilever growth of a material, comprising:
    etching a pattern onto a substrate, said pattern comprising at least one cantilever support region and at least one trench;
    forming a nucleation layer on said substrate;
    growing in a reactor by a vapor-phase growth technique a middle layer on said nucleation layer on said substrate, said middle layer providing surfaces for subsequent lateral cantilever growth;
    growing in said reactor without an intermediate removal step on said middle layer a growth layer of material wherein the growth is stopped prior to the lateral cantilever growth originating from the cantilever support region coalescing with the growth layer originating from the trench.

20. The process of claim 19 wherein the growth of the growth layer has a lateral growth rate less than the vertical growth rate.

21. The process of claim 19 wherein the growth of the growth layer has a lateral growth rate greater than the vertical growth rate.

* * * * *